(12) United States Patent
Chiang et al.

(10) Patent No.: US 7,508,032 B2
(45) Date of Patent: Mar. 24, 2009

(54) HIGH VOLTAGE DEVICE WITH LOW ON-RESISTANCE

(75) Inventors: Puo-Yu Chiang, Yilan County (TW); Tsung-Yi Huang, Hsinchu (TW); Fu-Hsin Chen, Hsinchu County (TW); Ting-Pang Li, Hsinchu (TW); Chung-Yeh Wu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 61 days.

(21) Appl. No.: 11/676,624

(22) Filed: Feb. 20, 2007

(65) Prior Publication Data

US 2008/0197410 A1    Aug. 21, 2008

(51) Int. Cl.
*H01L 29/94*    (2006.01)
(52) U.S. Cl. .............................. 257/345; 257/E29.012; 438/298
(58) Field of Classification Search ................. 257/213, 257/288, 327, 345, E29.008, E29.012, E29.014; 438/142, 197, 218, 221, 225, 294, 296, 297, 438/298
See application file for complete search history.

(56) References Cited

U.S. PATENT DOCUMENTS

| | | | |
|---|---|---|---|
| 5,880,515 A * | 3/1999 | Bartlett | 257/547 |
| 2002/0098637 A1 * | 7/2002 | Hossain et al. | 438/200 |

\* cited by examiner

*Primary Examiner*—Evan Pert
*Assistant Examiner*—Kevin Quinto
(74) *Attorney, Agent, or Firm*—Thomas, Kayden, Horstemeyer & Risley

(57) ABSTRACT

A high-voltage transistor device has a first well region with a first conductivity type in a semiconductor substrate, and a second well region with a second conductivity type in the semiconductor substrate substantially adjacent to the first well region. A field ring with the second conductivity type is formed on a portion of the first well region, and the top surface of the field ring has at least one curved recess. A field dielectric region is formed on the field ring and extends to a portion of the first well region. A gate structure is formed over a portion of the field dielectric region and extends to a portion of the second well region.

18 Claims, 5 Drawing Sheets

HIGH VOLTAGE DEVICE WITH LOW ON-RESISTANCE

TECHNICAL FIELD

The present invention relates to semiconductor devices and methods, and particularly to a high voltage device with low on-resistance and high breakdown voltage.

BACKGROUND

In general, high-voltage integrated circuits (ICs) in which at least one high-voltage transistor is arranged on the same chip together with low-voltage circuits are widely used in a variety of electrical applications. Breakdown voltage and on-resistance ($R_{on}$) are two important characteristics of a MOSFET when used in a power switch circuit. Improving the operation of a power switch circuit incorporating MOSFETs suggests using a MOSFET with a breakdown voltage as high as possible and an on-resistance as low as possible. However, low on-resistance and high breakdown voltage parameters are contradictory to each other in current process technologies.

A lateral power MOSFET is basically a metal oxide semiconductor field effect transistor fabricated with coplanar drain and source regions. A problem with this type of lateral power MOSFET is that it cannot maintain a low on-resistance when a high voltage is passed through the lateral power MOSFET. The on-resistance is the power of the current that is transformed into heat as the current travels through the device. The larger the on-resistance of the device, the less efficient the device. Accordingly, a field ring (a p-ring structure) is inserted in an N well region beneath the field oxide region to reduce the surface electrical field and improves the depletion capability of the drift region. As a result, the doping concentration of the drift region can be increased and the on-resistance of the device can be decreased. However, the breakdown voltage is still not good enough to endure the power spikes. The breakdown voltage is the voltage at which a normally high-resistance element (such as a MOS capacitor or reverse biased p-n junction) allows current to flow. When voltage larger than the breakdown voltage is passed through devices, catastrophic and irreversible damage is done to the devices, rendering the devices commercially useless and requiring the devices to be replaced. Accordingly, increasing the breakdown voltage is highly desirable.

There is a trade-off relationship between breakdown voltage and on-resistance. For switching power applications, lower on-resistance means higher efficiency, and higher breakdown means higher tolerance for power spikes. What is needed in the art, therefore, is a novel MOSFET with a reduced on-resistance and a higher breakdown voltage when the device is placed under a high voltage.

SUMMARY OF THE INVENTION

Embodiments of the present invention include a high voltage device with a reduced surface field (RESURF) structure between a drain region and a gate electrode for increasing a breakdown voltage while maintaining a low on-resistance.

In one aspect, the present invention provides a high voltage device including a first well region with a first conductivity type in a semiconductor substrate, and a second well region with a second conductivity type in the semiconductor substrate substantially adjacent to the first well region. A field ring with the second conductivity type is formed on a portion of the first well region, and the top surface of the field ring has at least one curved recess. A field dielectric region is formed on the field ring and extends to a portion of the first well region. A gate structure is formed over a portion of the field dielectric region and extends to a portion of the second well region.

In another aspect, the present invention provides a method of forming a high voltage device including the steps of: providing a semiconductor substrate having a first area and a second area substantially adjacent to the first area; providing a patterned structure on the semiconductor substrate to expose at least one portion of the first area; performing a first ion implantation process to form at least one doped region having a first conductivity type on the exposed portion of the first area; performing a first oxidation process to form at least one oxide region on the exposed portion of the first area; removing the patterned structure and then forming a first masking layer to cover the second area; performing a second ion implantation process to form a first well region having the first conductivity type on the first area; removing the first masking layer and then forming a second masking layer to cover the first area; performing a third ion implantation process to form a second well region having a second conductivity type on the second area; removing the second masking layer; and removing the at least one oxide region to form at least one curved recess on the top surface of the first well region.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
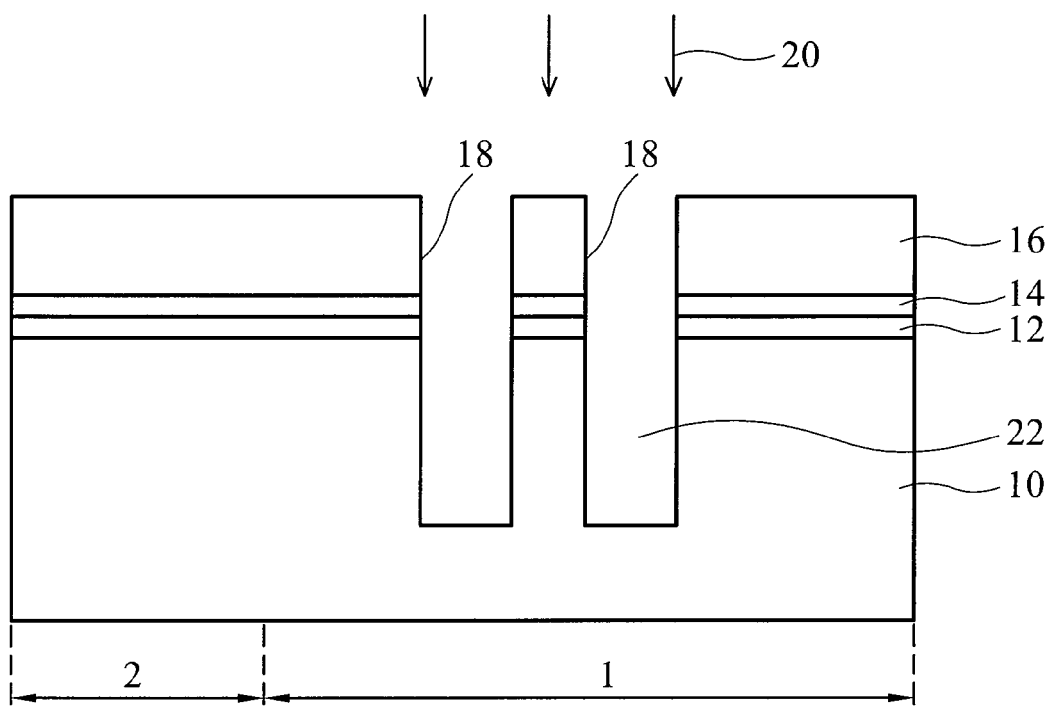
FIG. 1 to FIG. 7 are cross-sectional diagrams illustrating an exemplary embodiment of a well oxidation method of forming an LDMOS transistor with a RESURF structure.

Preferred embodiments of the present invention provides a high voltage device such as a lateral double-diffused MOS (LDMOS) transistor with a reduced surface field (RESURF) structure between a drain region and a gate electrode for increasing a breakdown voltage while maintaining a low on-resistance. The RESURF technology shapes a field ring to redistribute a field density inside a LDMOS transistor, thus a low on-resistance can be obtained. In an embodiment, the field ring is a p-type ring inserted in an n-well region between an n-type drain region and a gate electrode, and has a specific topography with at least one curved recess. This specific topography may be formed by thermal well oxidation process or etching process. The LDMOS transistor with a RESURF structure can be merged into various technology processes, such as high voltage process, low voltage mixed mode process, and low voltage logic process Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, cross-sectional diagrams of FIG. 1 to FIG. 7 illustrate an exemplary embodiment of a well oxidation method of forming an LDMOS transistor with a RESURF structure.

Referring to FIG. 1, a semiconductor substrate 10 is provided with a first area 1 for forming a high-voltage n-well region and a second area 2 for forming a high-voltage p-well region. In an embodiment, the semiconductor substrate 10 is a p-type substrate. The substrate 10 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

In RESURF technology, a patterned structure is needed for identifying predetermined oxidation regions. For example, a pad oxide layer 12, a silicon nitride layer 14 and a photoresist layer 16 are successively formed on the substrate 10 and then patterned by the use of photolithography and dry etch technology to form at least one opening 18 exposing a predetermined portion of the first area 1 of the substrate 10. As illustrated in FIG. 1, two openings 18 are provided to define two predetermined oxidation regions. Then an n-type ion implantation 20 is performed on the substrate 10 with the patterned structure as the implantation mask, forming n-type regions 22 in the first area 1 of the substrate 10.

Figure 2:
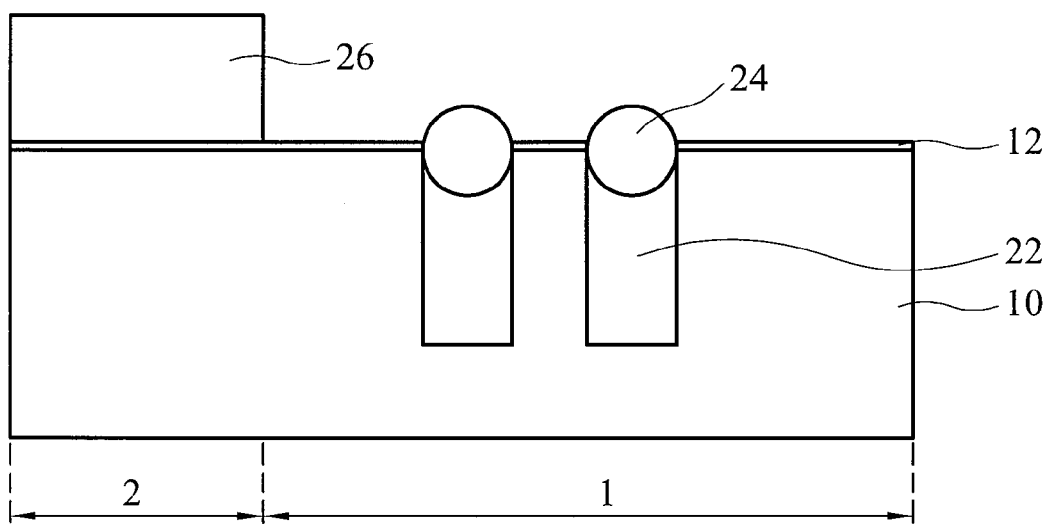
Figure 3:
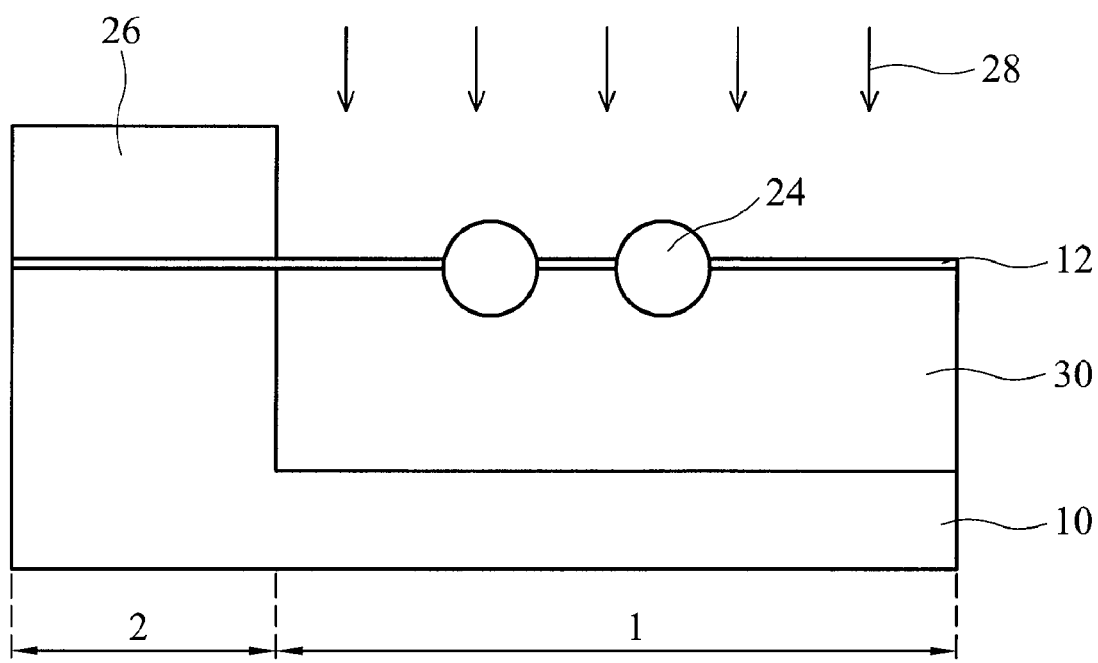

Referring to FIG. 2, a thermal oxidation process is performed to form two oxidation regions 24 on the exposed surfaces of the n-type regions 22 respectively, followed by removing the first photoresist layer 16. And then the silicon nitride layer 14 is removed. A second photoresist layer 26 is then provided on the pad oxide layer 12 to cover the second area 2 of the substrate 10. Next, another n-type ion implantation 28 is performed with the second photoresist layer 26 as the implantation mask so as to form an n-well region 30 (including the n-type regions 22) on the first area 1 of the substrate 10 as depicted in FIG. 3. The n-well region 30 may be formed by implanting an n-type dopant such as phosphorous to a concentration of about $3 \times 10^{15}$ to about $3 \times 10^{16}$ dopant concentration at about 180 KeV, for example. Other n-type dopants such as arsenic, nitrogen, antimony, combinations thereof, or the like, could alternatively be used. In an embodiment, the n-well region 30 has a thickness of about between about 4 μm and about 10 μm.

Figure 4:
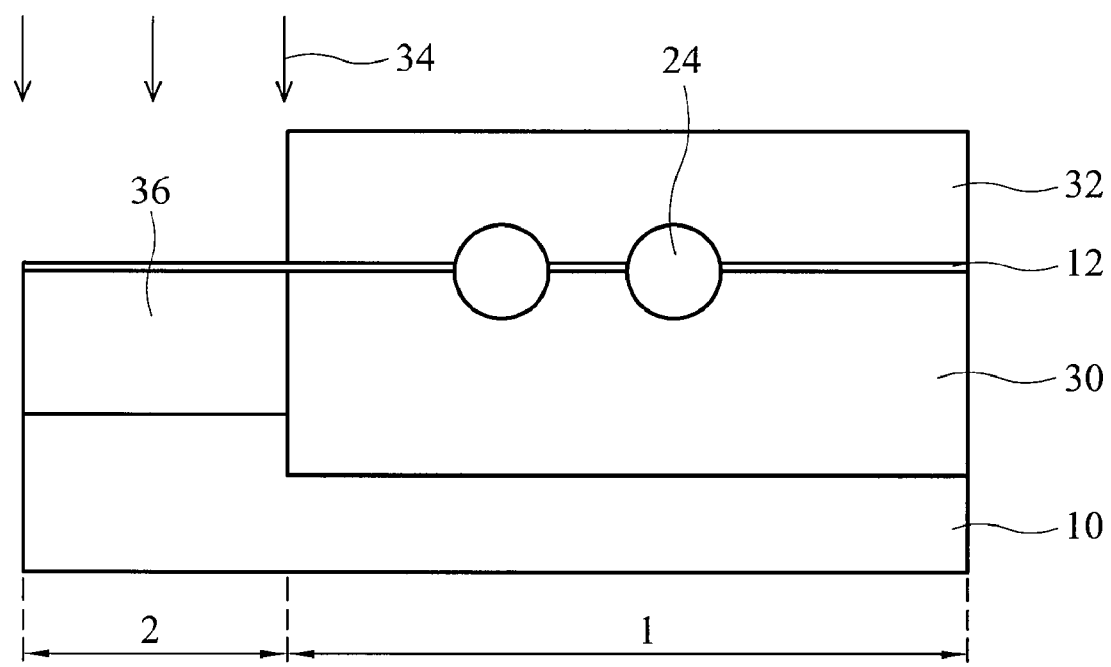

In FIG. 4, the second photoresist layer 26 is removed from the second area 2, and then a third photoresist layer 32 is provided to cover the first area 1. The third photoresist layer 32 acts an implantation mask in the following p-type ion implantation process 34, resulting in a p-well region 36 on the second area 2 substantially adjacent to the n-well region 30. Therefore a junction between the two wells is created. The p-well region 36 may be formed by doping a p-type dopant such as boron at a concentration of between about $1 \times 10^{15}$ to about $2 \times 10^{16}$ at a power of about 100 keV, as an example. In an embodiment, the p-well region 36 has a depth of between about 2 μm to about 6 μm. Other p-type dopants such as gallium, aluminum, indium, combinations thereof, or the like could alternatively be used.

Figure 5:
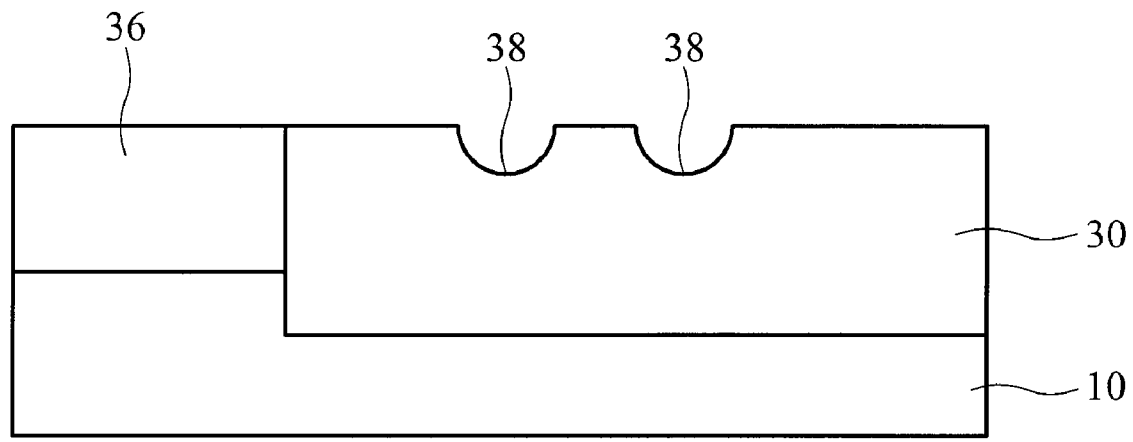
Figure 6:
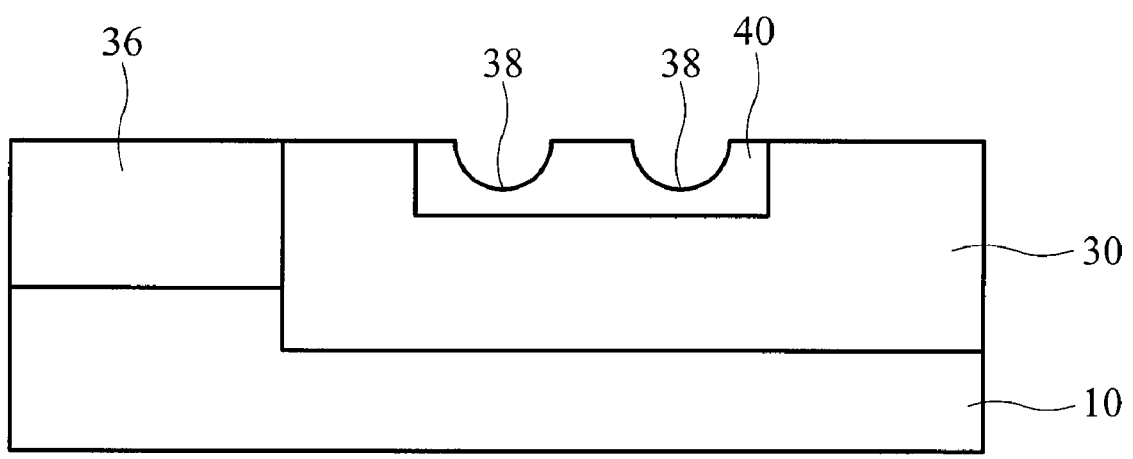

In FIG. 5, the third photoresist layer 32 is removed, and then the pad oxide layer 12 and the oxidation regions 24 are removed from the substrate 10 by the use of wet etch process for example, creating two curved recesses 38 on the top surface of the n-well region 30. Next, in FIG. 6, a portion of the n-well region 30 is counter-doped with a p-type dopant to form a field ring 40 (a p-ring structure). The field ring 40 has a specific topography with two curved recesses 38 to act a reduced surface field (RESURF) structure. The field ring 40 may be formed by doping a portion of the n-well region 30 with boron to a depth of between about 0.4 μm to about 2 μm, with a preferred depth of about 1 μm. Other p-type dopants such as gallium, aluminum, indium, combinations thereof, or the like could alternatively be used.

Figure 7:
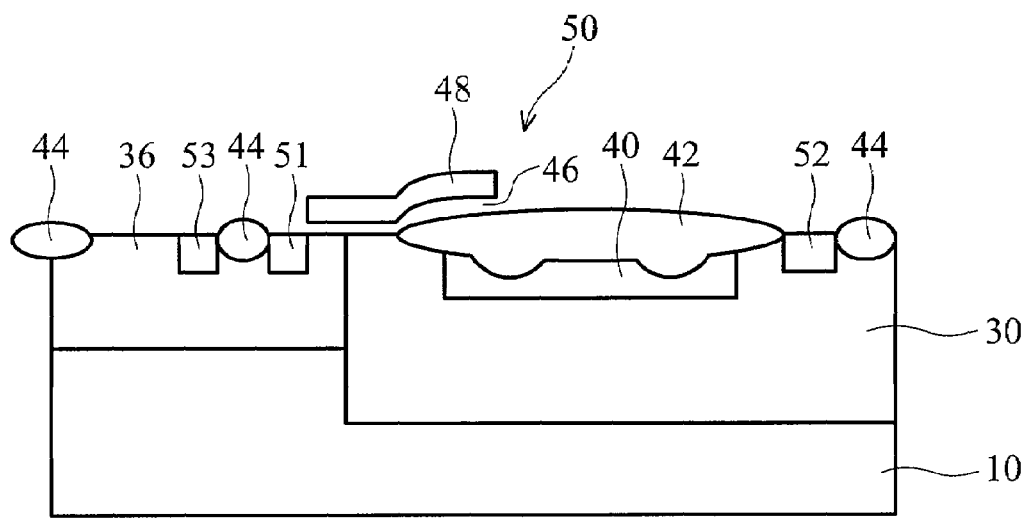

FIG. 7 illustrates the formation of field dielectric regions, a gate structure and source/drain regions on the high-voltage device area. The first field dielectric region 42 is formed on the field ring 40, and the second field dielectric regions 44 are formed on portions of the p-type well region 36 and the n-type well region 30. The invention may adopt STI (shallow trench isolation) technique or LOCOS (local oxidation of silicon) isolation technique to fabricate the field dielectric regions 42 and 44. In an embodiment, the field dielectric regions 42 and 44 are preferably formed simultaneously. The field dielectric regions 42 and 44 may comprise silicon dioxide, formed by patterning a masking layer (not shown) to expose desired portions of the substrate 10, heating the substrate 10 in the presence of oxygen at a temperature of about 980° C., and then removing the masking layer. The field dielectric regions 42 and 44 may comprise a thickness of between about 3,000 Å and about 7,000 Å. However, the field dielectric regions 42 and 44 may alternately comprise other thicknesses and materials.

A gate structure 50 is then formed over an upper portion of the first field dielectric region 42 and extends to cover a portion of the p-type well region 36. The gate structure 50 comprises a gate dielectric layer 46 and a gate electrode layer 48. The gate dielectric layer 46 may be formed of silicon oxide, silicon oxynitride, silicon nitride, high-k dielectrics (e.g., k>4.0), transition metal oxides, and rare earth metal oxides by using any process known in the art, e.g., thermal oxidation and chemical vapor deposition (CVD). The thickness of the gate dielectric layer 46 is chosen specifically for the scaling requirements of the high-voltage device technology. The gate electrode layer 48 may be formed of polysilicon, amorphous polysilicon, doped polysilicon, polysilicon-germanium, metal, or combinations thereof by using CVD, sputtering or thermal growth processes. Optionally, a surface of the gate electrode layer 48 may be silicided.

A source region 51 is formed on the p-type well region 36 and a drain region 52 is formed on the n-type well region 30 by implanting an n-type dopant such as phosphorous at a concentration of between about $1 \times 10^{19}$ and about $2 \times 10^{20}$ at about 80 KeV, as examples. However, other n-type dopants such as arsenic, nitrogen, antimony, combinations thereof, or the like could alternatively be used. In addition, a p$^+$ region 53 is formed on the p-type well region 36 by implanting boron at a concentration of between about $1 \times 10^{19}$ and about $2 \times 10^{20}$ at about 70 keV, as an example. Other p-type dopants such as gallium, aluminum, indium, combinations thereof, or the like could alternatively be used. In the first area 1, the drain region 52 formed between the first field dielectric region 42 and the second field dielectric region 44, is not substantially adjacent to the field ring 40. In the second area 2, the source region 51 is formed adjacent to the gate structure 50 and isolated from the p+ region 53 by the second field dielectric region 44.

Referring to FIG. 7, the LDMOS device includes a reduced surface field (RESURF) structure between the drain region 44 and the gate electrode layer 48, and the specific topography including at least one curved recess 38 on the silicon material can increase a breakdown voltage while maintaining a low on-resistance. In general, the device breakdown occurs at the silicon surface, especially in the field dielectric edge, polysilicon gate edge and drain side. The RESURF structure can reduce the surface electric field to increase the device breakdown voltage without increasing the on-resistance. Therefore, the n drift region can be used more efficiently than the conventional structure.

Figure 8:
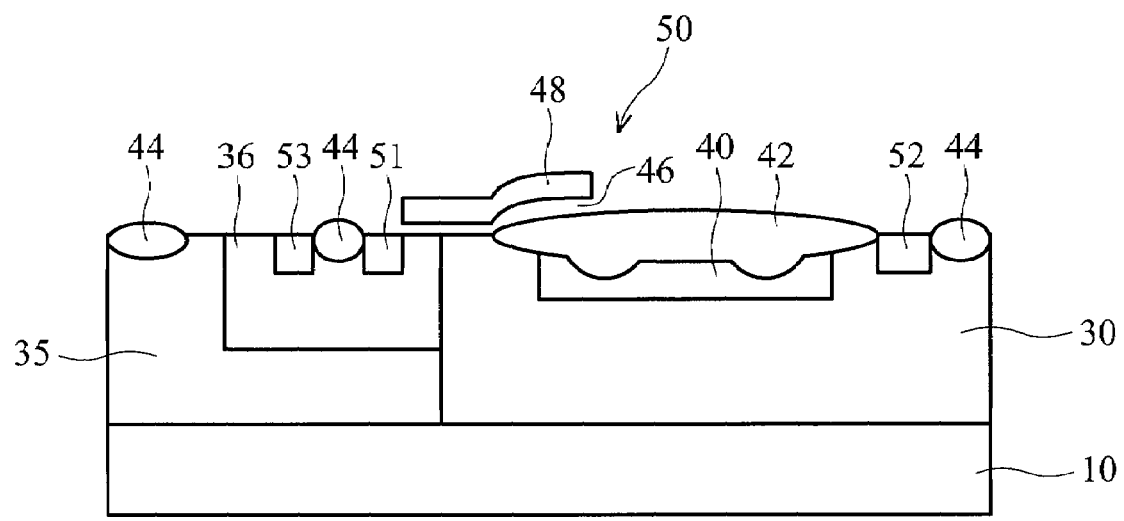
FIG. 8 is a cross-sectional diagram illustrating an epitaxial layer formed in an LDMOS transistor with a RESURF structure in accordance with an embodiment of the present invention.

FIG. 8 illustrates an epitaxial layer 35 formed in the substrate 10 in accordance with an embodiment of the present invention, while explanation of the same or similar portions to the description in FIG. 7 will be omitted. The epitaxial layer 35 is a doped semiconductor material, preferably a P-type semiconductor such as silicon. The doped semiconductor material is preferably formed epitaxially, although other methods may alternatively be used. The doped semiconductor material is referred to herein as a p-type epitaxial layer. The p-type epitaxial layer is formed in a thickness between about 2 μm and about 5 μm, and more preferably to a thickness of about 4 μm in an embodiment; however, other thicknesses may be used. The p-type epitaxial layer may be doped with boron, for example, although other p-type dopants such as gallium, aluminum, indium, combinations thereof, or the like may alternatively be used.

Figure 9:
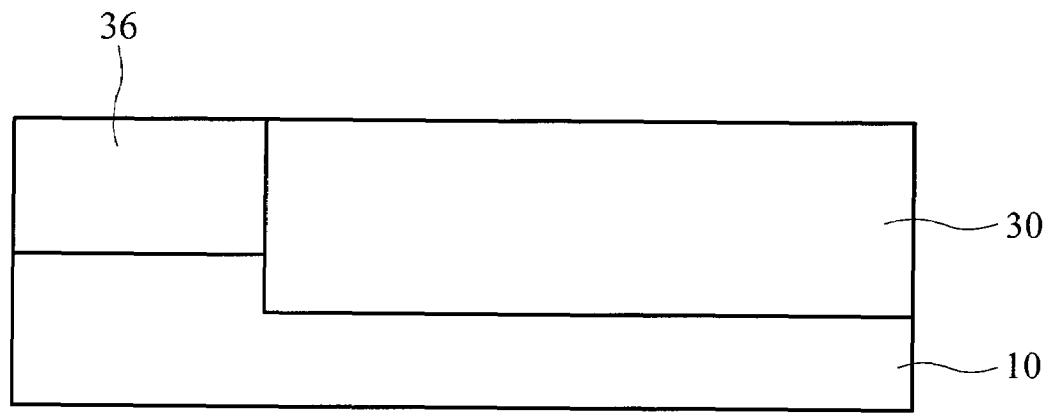
FIG. 9 to FIG. 10 are cross-sectional diagrams illustrating an exemplary embodiment of an etching method of forming an LDMOS transistor with a RESURF structure.
Figure 10:
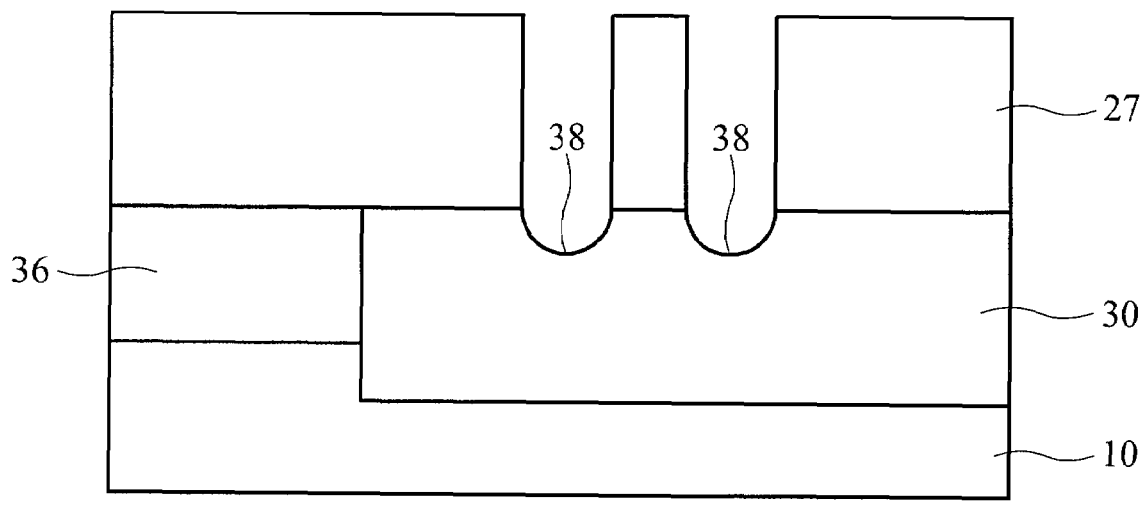

FIG. 9 to FIG. 10 are cross-sectional diagrams illustrating an exemplary embodiment of an etching method of forming an LDMOS transistor with a RESURF structure, while explanation of the same or similar portions to the description in FIGS. 1-7 will be omitted. The substrate 10 is provided with the p-type well region 36 in the second area 2 and the n-type well region 30 in the first area 1 as depicted in FIG. 9. Then, in FIG. 10, a masking layer 27 is formed over the substrate 10 to expose at least a predetermined portion of the n-type well region 30 followed by an etching process 39, forming at least one curved recess 38 on the exposed silicon surface. The masking layer 27 is removed, and then a portion of the n-well region 30 is counter-doped with a p-type dopant to form the field ring 40 (p-ring structure). The field ring 40 has a specific topography with at least one curved recess 38 to act a reduced surface field (RESURF) structure.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A high voltage device, comprising:
a semiconductor substrate;
a first well region having a first conductivity type formed in said semiconductor substrate;
a second well region having a second conductivity type formed in said semiconductor substrate substantially adjacent to said first well region;
a field ring having said second conductivity type formed on a portion of said first well region, wherein the top surface of said field ring comprises at least two adjacent curved recesses;
a field dielectric region formed on said field ring and extending to a portion of said first well region, wherein the field dielectric region connects the at least two adjacent curved recesses; and
a gate structure formed over a portion of said field dielectric region and extending to a portion of said second well region.

2. The high voltage device of claim 1, wherein said first conductivity type is n type conductivity.

3. The high voltage device of claim 1, wherein and said second conductivity type is p type conductivity.

4. The high voltage device of claim 1, further comprising an epitaxial layer having said second conductivity type formed in said semiconductor substrate substantially adjacent to said first well region, wherein said second well region is formed in said epitaxial layer.

5. The high voltage device of claim 1, further comprising a source region formed in said second well region adjacent to said gate structure.

6. The high voltage device of claim 1, wherein said field dielectric region is a silicon oxide region.

7. The high voltage device of claim 1, wherein said high voltage device is an LDMOS transistor device.

8. The high voltage device of claim 1, further comprising a drain region formed in said first well region, not substantially adjacent to said field ring.

9. The high voltage device of claim 8, wherein said field ring having at least one curved-recess surface is formed between said gate structure and said drain region.

10. A method of forming a high voltage device, comprising:
providing a semiconductor substrate having a first area and a second area substantially adjacent to said first area;
providing a patterned structure on said semiconductor substrate to expose at least one portion of said first area;
performing a first ion implantation process to form at least one doped region having a first conductivity type on said exposed portion of said first area;
performing a first oxidation process to form at least one oxide region on said exposed portion of said first area;
removing said patterned structure, and then forming a first masking layer to cover said second area;
performing a second ion implantation process to form a first well region having said first conductivity type on said first area;
removing said first masking layer and then forming a second masking layer to cover said first area;
performing a third ion implantation process to form a second well region having a second conductivity type on said second area;
removing said second masking layer; and
removing said at least one oxide region to form at least one curved recess on the top surface of said first well region.

11. The method of claim 10, wherein the first oxidation process forms at least two oxide regions, and the step of removing said at least one oxide region forms at least two curved recesses on the top surface of said first well region.

12. The method of claim 10, wherein said first conductivity type is n type conductivity, and the second conductivity type is p type conductivity.

13. The method of claim 10, further comprising forming an epitaxial layer having said second conductivity type in said second area, wherein said second well region is formed in said epitaxial layer.

14. The method of claim 10, further comprising performing a fourth ion implantation process to form a field ring having said second conductivity type on a portion of said first well region, wherein the top surface of said field ring has at least one curved recess.

15. The method of claim 14, further comprising performing a second oxidation process on a portion of said first well region to form a field oxide region on the top surface of said field ring.

16. The method of claim 15, further comprising forming a gate structure over said field oxide region extending to a portion of said second well region.

17. The method of claim 16, further comprising forming a drain region in said first well region, not substantially adjacent to said field ring.

18. The method of claim 16, further comprising forming a source region in said second well region adjacent to said gate structure.

* * * * *